(12) United States Patent
Hanna

(10) Patent No.: US 12,416,671 B2
(45) Date of Patent: Sep. 16, 2025

(54) SWITCHGEAR GROUND AND TEST DEVICE HAVING FIRST AND SECOND SETS OF GROUNDING BARS AND GROUND SHOE ASSEMBLY

(71) Applicant: JST POWER EQUIPMENT, INC., Lake Mary, FL (US)

(72) Inventor: Robert L. Hanna, Enterprise, FL (US)

(73) Assignee: JST POWER EQUIPMENT, INC., Lake Mary, FL (US)

( * ) Notice: Subject to any disclaimer, the term of this patent is extended or adjusted under 35 U.S.C. 154(b) by 176 days.

(21) Appl. No.: 18/527,435

(22) Filed: Dec. 4, 2023

(65) Prior Publication Data
US 2024/0118341 A1    Apr. 11, 2024

Related U.S. Application Data

(63) Continuation-in-part of application No. 18/366,724, filed on Aug. 8, 2023, now Pat. No. 12,025,665, which is a continuation of application No. 17/651,069, filed on Feb. 15, 2022, now Pat. No. 11,762,020.

(51) Int. Cl.
  *G01R 31/327*    (2006.01)
  *H02B 1/16*    (2006.01)

(52) U.S. Cl.
  CPC .......... *G01R 31/3272* (2013.01); *H02B 1/16* (2013.01)

(58) Field of Classification Search
  CPC .............................. G01R 31/3272; H02B 1/16
  See application file for complete search history.

(56) References Cited

U.S. PATENT DOCUMENTS

| | | |
|---|---|---|
| 3,161,804 A | 12/1964 | Guinan |
| 9,607,784 B2 | 3/2017 | Benke et al. |
| 9,634,469 B2 | 4/2017 | Frye et al. |
| 10,050,420 B1 * | 8/2018 | Yonce ................... H02B 11/04 |
| 10,613,133 B2 | 4/2020 | Ashtekar et al. |
| 10,693,284 B2 | 6/2020 | Benson |

(Continued)

OTHER PUBLICATIONS

"Manual Ground & Test Devices—Installation, Operations and Maintenance Manual," 5/15/27 kV, 25/31.5/50/63 kA; ABB, Inc.; 1VAL064601-MB, Rev. C; Feb. 2015; 22 pages. See Priority U.S. Appl. No. 17/651,069, filed Feb. 15, 2022.

(Continued)

*Primary Examiner* — Jermele M Hollington
*Assistant Examiner* — Zannatul Ferdous
(74) *Attorney, Agent, or Firm* — ALLEN, DYER, DOPPELT + GILCHRIST, P.A.

(57) ABSTRACT

A ground and test (G&T) device includes a test device housing having upper terminals and lower terminals carried by the test device housing and engaging the load and line conductors when the test device housing in installed within the compartment of the switchgear frame. A plurality of grounding bars include a first set of grounding bars that connect the upper terminals to a lower ground bar and a second set of grounding bars that connect the lower terminals to the lower ground bus bar when the first set of grounding bars are not connected. A ground shoe assembly is connected to the lower ground bus bar and configured to engage a grounding circuit carried by the switchgear frame and includes a ground shoe bracket, bus bars, and die springs.

17 Claims, 15 Drawing Sheets

(56) References Cited

U.S. PATENT DOCUMENTS

| | | |
|---|---|---|
| 11,735,893 B2 | 8/2023 | Hanna et al. |
| 11,762,020 B2 | 9/2023 | Hanna et al. |
| 2015/0332883 A1* | 11/2015 | Benke ............... H01H 3/32 335/10 |
| 2016/0241003 A1 | 8/2016 | Frye et al. |
| 2019/0072602 A1* | 3/2019 | Ashtekar ............ H02B 11/28 |
| 2023/0375619 A1 | 11/2023 | Hanna et al. |

OTHER PUBLICATIONS

"PowlVac Manually Operated Ground & Test Device," 5kV & 15kV, 50kA/1000MVA, 3000A; 01.4IB.50010C; Powell Electrical Systems, Inc.; May 2013; 21 pages. See Priority U.S. Appl. No. 17/651,069, filed Feb. 15, 2022.

"Ground & Test Device Manually Operated," 5kV & 15kV, 63kA, 3000A; 01.4IB.50011A PowlVac Type M 63kA; Powell Electrical Systems, Inc.; Jun. 2014; 26 pages. See Priority U.S. Appl. No. 17/651,069, filed Feb. 15, 2022.

GE Industrial Solutions, "SecoVac Ground & Test Device," DEH-50007 Installation, Operation and Maintenance Manual; Retrieved from the Internet: https://library.e.abb.com/public/41a6ca296b02427d952d4ce026f581f0/DEH-50007%20GE_SecoVac-Ground-and-Test-Device-Manual.pdf; July 28, 2021; pp. 1-20. See Priority U.S. Appl. No. 17/651,069, filed Feb. 15, 2022.

\* cited by examiner

SWITCHGEAR GROUND AND TEST DEVICE HAVING FIRST AND SECOND SETS OF GROUNDING BARS AND GROUND SHOE ASSEMBLY

PRIORITY APPLICATION(S)

This is a continuation-in-part (CIP) application based upon U.S. patent application Ser. No. 18/366,724 filed Aug. 8, 2023, which is a continuation application based upon U.S. patent application Ser. No. 17/651,069 filed Feb. 15, 2022 (now U.S. Pat. No. 11,762,020), the disclosures which are hereby incorporated by reference in their entirety.

FIELD OF THE INVENTION

The present invention relates to the field of electronic systems, and more particularly, this invention relates to ground and test (G&T) devices used with switchgear systems.

BACKGROUND OF THE INVENTION

Metal-clad or metal-enclosed medium voltage switchgear systems operate as three-phase systems that connect to the three-phase power distribution grid and provide various control functions and provide protection against short circuit events and similar overcurrent or other fault conditions. They often include circuit breakers, which open and close individual circuits and are mounted on a truck that is movable within a compartment of a switchgear frame. Circuit breakers may include vacuum interrupters, with a respective vacuum interrupter forming a single-phase circuit breaker for one of the three-phases.

The vacuum interrupters are removable from the switchgear frame by disengaging the circuit breaker from the load and line conductors and racking out the truck carrying the vacuum interrupters from the switchgear compartment. The metal-clad switchgear is compartmentalized and uses grounded metal components for many parts of the circuit to help minimize fault propagation and to make repairs easier and safer. An electrical bus may be insulated to minimize a potential flash over or fault between phases of circuits within the switchgear system.

During maintenance, the conventional and standard electrical safety practices require the insertion of a temporary grounding device within the switchgear compartment to protect the electrician from accidental energization of power equipment in the system and permit grounding of any high voltages that may remain on a line. It is necessary to ground the high voltage electric lines to protect personnel working on these lines and protect circuit components. It is also desirable to be able to test phase out, voltages, and selectively ground either the bus or line circuits during maintenance and testing.

There are numerous designs for ground and test devices used in switchgear systems. These designs include: 1) simple manual; 2) complex manual; 3) simple electrical; and 4) complex electrical. A simple manual ground and test device usually includes upper and lower terminals that connect load and line conductors to a ground circuit. Some simple manual ground and test devices use flexible cables that knock each other during operation of the ground and test device and strip insulation from the cables, creating a safety hazard. Also, some grounding mechanisms employed in these ground and test devices do not provide an adequate ground connection when in use.

SUMMARY OF THE INVENTION

This summary is provided to introduce a selection of concepts that are further described below in the Detailed Description. This summary is not intended to identify key or essential features of the claimed subject matter, nor is it intended to be used as an aid in limiting the scope of the claimed subject matter.

In general, a ground and test (G&T) device may comprise a test device housing configured to be removably installed within a compartment of a switchgear frame having load and line conductors. A plurality of upper terminals and plurality of lower terminals may be carried by the test device housing and configured to engage the load and line conductors when the test device housing is installed within the compartment of the switchgear frame. A lower ground bus bar may be carried by the test device housing. A plurality of grounding bars may selectively connect either the upper terminals to the lower ground bus bar or connect the lower terminals to the lower ground bus bar. The plurality of grounding bars include a first set of grounding bars that connect the upper terminals to the lower ground bus bar when the first set of grounding bars are not connected.

A ground shoe assembly may be connected to the lower ground bus bar and configured to engage a grounding circuit carried by the switchgear frame. The ground shoe assembly includes a ground shoe bracket and first and second opposing bus bars each having first and second ends and carried by the ground shoe bracket. The first ends engage the grounding circuit. First and second flexible cables interconnect each of the second ends to the lower ground bus bar. Die springs are carried by the ground shoe bracket and exert a biasing force against first and second bus bars.

The G&T device may comprise three upper terminals and three lower terminals configured to engage respective three-phase load and line conductors. Each grounding bar in first and second sets may comprise an upper flat end that is configured to engage the respective upper or lower terminal, an outwardly angled section that extends outward from the test device housing, and a vertically extending lower flat section that is configured to engage the lower ground bus bar. The test device housing may include a front panel having removable upper and lower doors to expose upper and lower terminals onto which the grounding bars are secured. The upper and lower terminals may comprise upper and lower contact arms each carrying cluster assemblies that engage load and line conductors.

Each of the first and second opposing bus bars include flared ends that extend outward, and the grounding circuit includes a grounding bar over which the flared first ends engage as the test device housing is inserted within the compartment of the switchgear frame. The first and second flexible cables each may comprise a braided cable.

A method aspect of operating a ground and test (G&T) device may comprise installing a test device housing within a compartment of a switchgear frame having load and line conductors. The method may include engaging a plurality of upper terminals and a plurality of lower terminals carried by the test device housing with the load and line conductors, and selectively connecting a plurality of grounding bars with either the upper terminals to a lower ground bus bar carried by the test device housing or connecting the lower terminals to the lower ground bus bar. The grounding bars comprise a first set of grounding bars that connect the upper terminals to the lower ground bus bar and a second set of grounding bars that connect the lower terminals to the lower ground bus bar when the first set of grounding bars are not connected. The method includes connecting a ground shoe assembly to the lower ground bus bar and to a grounding circuit carried by the switchgear frame. The ground shoe assembly includes a ground shoe bracket and first and second opposing bus bars each having first and second ends and carried by the ground shoe bracket, the first ends engaging the grounding circuit. First and second flexible cables interconnect each of the second ends to the lower ground bus bar. Die springs are carried by the ground shoe bracket and exert a biasing force against first and second bus bars.

BRIEF DESCRIPTION OF THE DRAWINGS

Other objects, features and advantages of the present invention will become apparent from the Detailed Description of the invention which follows, when considered in light of the accompanying drawings in which.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
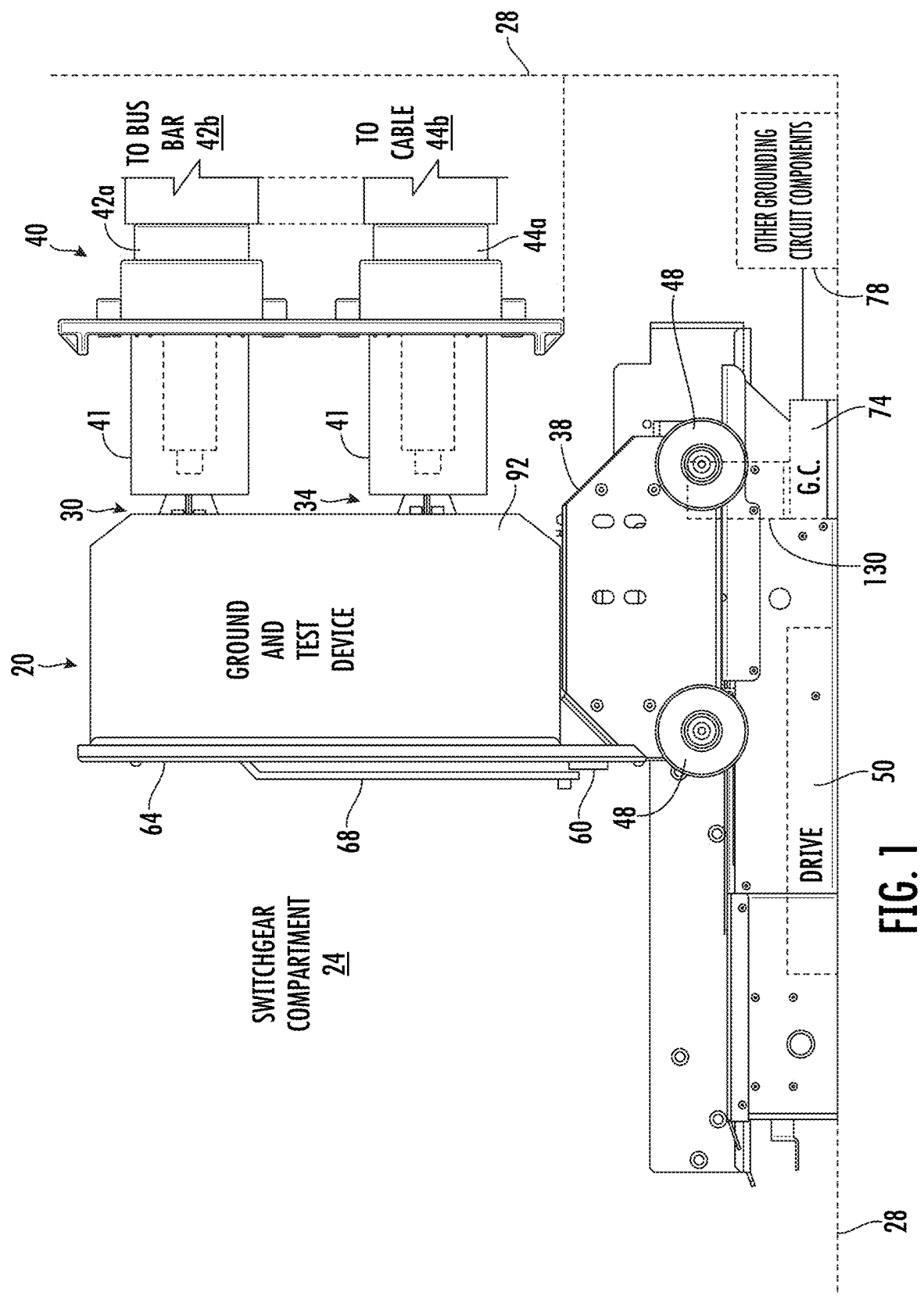
FIG. 1 is a side elevation view of the ground and test device showing upper and lower terminals connected to the load and line conductors in accordance with a non-limiting example.

Referring now to FIG. 1, there is illustrated the ground and test (G&T) device 20 that is removably installed within a switchgear compartment 24 of a switchgear frame shown by the dashed line at 28. The G&T device 20 includes a plurality of upper terminals 30 and a plurality of lower terminals 34 carried by a test device housing 38 and configured to engage load and line conductors 40 in the switchgear compartment 24 of the switchgear frame 28 when the test device housing 38 is installed in the switchgear compartment 24 of the switchgear frame 28.

The test device housing 38 may be configured similar to a conventional truck carrying conventional vacuum interrupters and insertable within the switchgear component 24, thus allowing the test device housing to be racked in and racked out, whether via a drive mechanism or manually. The test device housing 38 includes in this example three upper terminals 30 and three lower terminals 34 and is configured to engage the respective three-phase load and line conductors 40. For example, as shown in FIG. 1, the individual line conductors 42a may connect to a bus bar 42b and individual load conductors 44a may connect to a cable 44b. The upper terminals 30 may engage the line conductors 42a and connect to the bus bar 42b, which connect to outside high voltage sources, while the lower terminals 34 may connect to the load conductors 44a, and in turn, may connect to the cable 44b that connects to an apartment building or other load as non-limiting examples.

The test device housing 38 includes wheels 48 that allow the test device housing to be inserted within the switchgear compartment 24 of the switchgear frame 28. The wheels may roll on side rails (not shown) within the switchgear compartment 24 of the switchgear frame 28 and allow full insertion of the test device housing 38 such that the upper and lower terminals 30,34 engage the load and line conductors 40.

Although not illustrated in detail, the switchgear frame 28 supports a drive mechanism illustrated schematically by the dashed lines at 50 for each truck carrying a vacuum interrupter, and in turn, may be used to rack in and rack out a test device housing 38. Those skilled in the art should understand that the test device housing 38 may be racked in and racked out manually, such as by use of a hand crank or other mechanism or automatically via a drive mechanism 50. The test device housing 38 may have a width, height and depth that are similar in dimensions and configuration to a conventional truck carrying vacuum interrupters so that the test device housing may be received within the switchgear compartment 24 of the switchgear frame 28 with little difficulty.

Referring now more particularly to FIGS. 2-7, a lower ground bus bar 60 is carried by the test device housing 38 and formed in this example as a rectangular piece of bus that extends over the lower section of a front panel 64. A plurality of grounding bars 68 selectively connect either the upper terminals 30 to the lower ground bus bar 60 or connect the lower terminals 34 to the lower ground bus bar 60. A ground shoe assembly 70 is carried on the underside of the ground and test device 20 (FIGS. 6 and 7) and connected to the lower ground bus bar 60 and configured to engage a grounding circuit 74 (G.C.) carried by the switchgear frame 28. The grounding circuit 74 may connect to various switchgear and other grounding components 78 to aid in grounding the switchgear frame 28 during maintenance and protect workers downstream from the switchgear frame, such as those working on downstream line components, e.g., a transformer or breaker.

In this example, the ground and test device 20 includes three upper terminals 30 and three lower terminals 34 configured to engage the respective three-phase load and line conductors 40. Each grounding bar 68 is similarly configured and interchangeable with each other as best shown in example of FIGS. 4 and 5. The same grounding bars 68 are used to engage the upper terminals 30 and connect to the lower ground bus bar 60 (FIG. 4) or connect the lower terminals 34 to the lower ground bus bar (FIG. 5). Each grounding bar 68 includes an upper flat end 68a that is configured to engage either an upper terminal 30 or lower terminal 34, and an outwardly angled section 68b that extends outward from the test device housing 38, and a vertically extending lower flat section 68c that is configured at its lower end to engage the lower ground bus bar 60.

Figure 3:
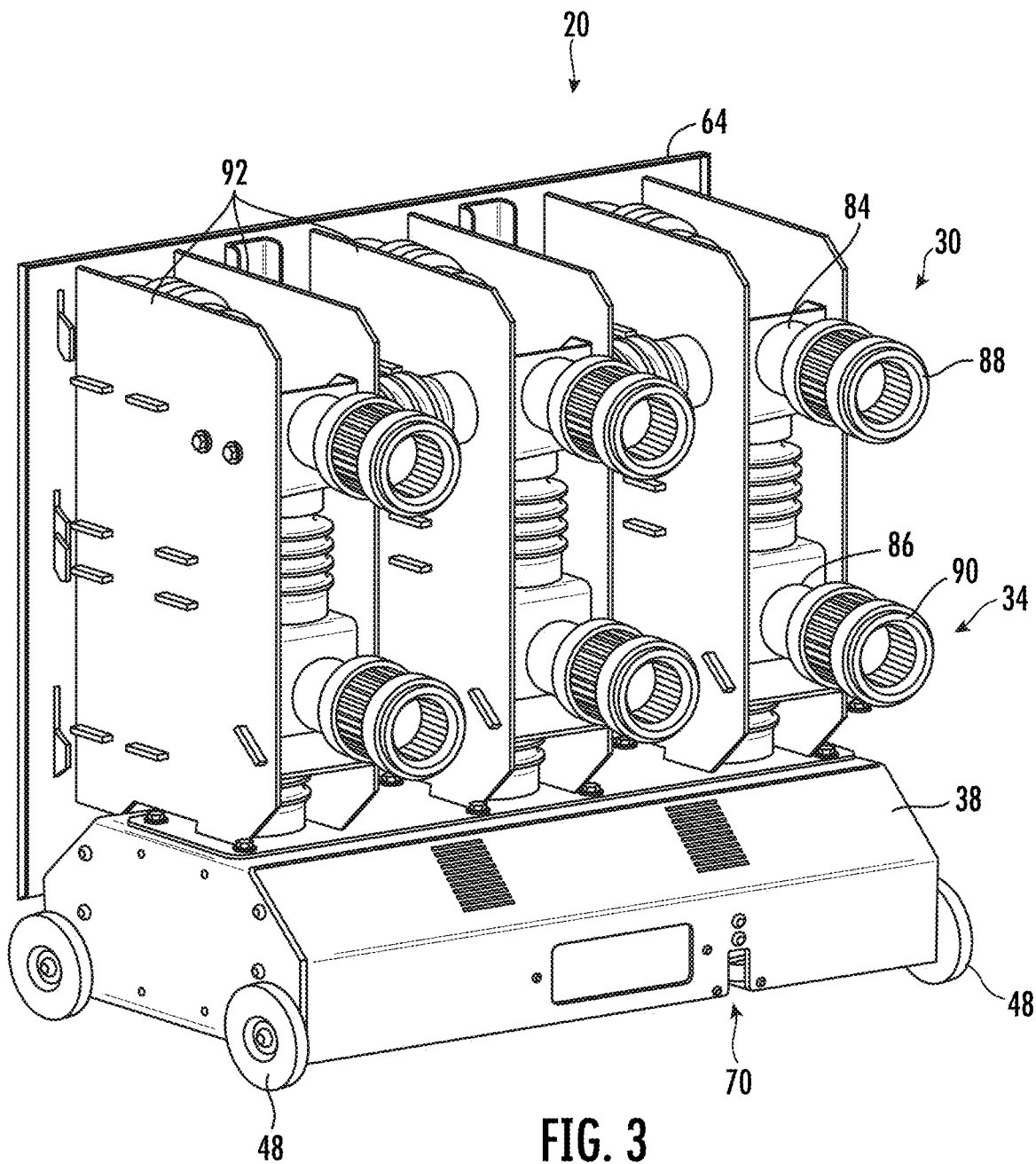
FIG. 3 is a rear isometric view of the ground and test device of FIG. 1 showing the upper and lower contact arms each carrying arm and cluster assemblies.

The test device housing 38 includes its front panel 64 that may have a removable upper door 78 and removable lower door 80 to expose the respective upper and lower terminals 30,34 onto which the grounding bars 68 are secured. Upper terminals 30 are exposed when the upper doors 78 are removed and the lower terminals 34 are exposed when the lower doors 80 are removed. On the side opposite from which the grounding bars 68 connect, the upper and lower terminals 30,34 each include respective upper and lower contact arms 84,86, which each carry respective upper and lower cluster assemblies 88,90 that engage the load and line conductors 40 (FIG. 3).

The ground and test device 20 includes ground and test barrier panels 92 that separate the different upper and lower contact arms 84,86 and the respective upper and lower cluster assemblies 88,90 that engage the load and line conductors 40. In this example, six vertical barrier panels 92 are employed (FIG. 3). As illustrated, the test and device housing 38 and upper and lower cluster assemblies 88,90 and upper and lower contact arms 84,86 are similarly configured and dimensioned as a conventional truck carrying vacuum interrupters, such as disclosed in the incorporated by reference U.S. Pat. No. 11,735,893, such that when the ground and test device is inserted, the cluster assemblies 88,90 engage in a proper fit the load and line conductors, which include receptacles 41 that receive the cluster assemblies (FIG. 1).

The test device housing 38 includes its front panel 64 having its removable upper and lower doors 78,80, which each include pull handles 94 and a ground and test lock mechanism 96 to allow a padlock or locking mechanism to be inserted within the lock mechanism and prevent the locked doors 78,80 from being removed. The front panel 64 also includes a ground and test upper bus bracket 102 and lower bus bracket 104 and a ground and test grounding bus 106 connected between the two bus brackets.

Figure 4:
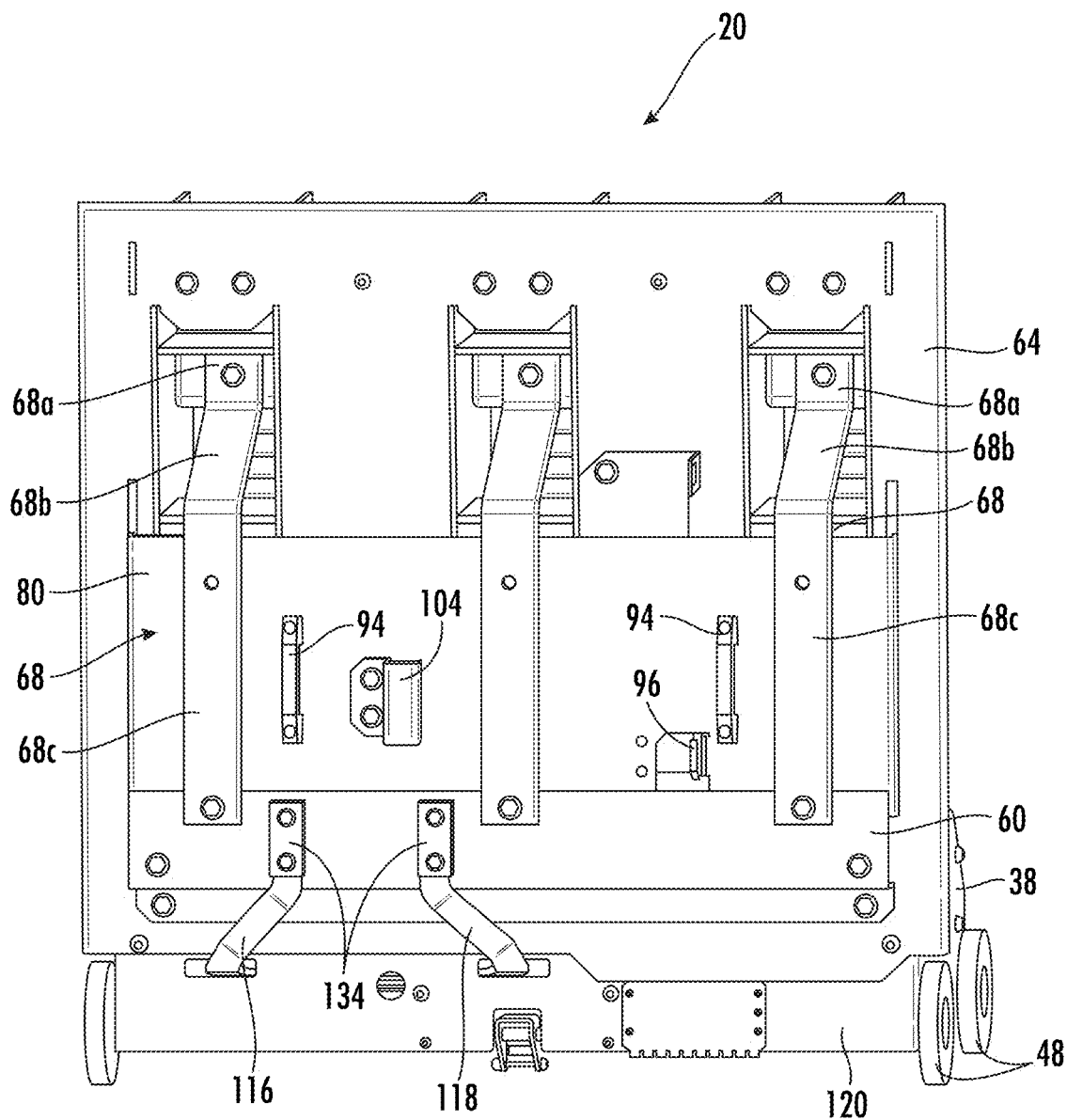
FIG. 4 is another front isometric view of the ground and test device showing the upper door removed and the grounding bars connected between the upper terminals and lower ground bus bar.
Figure 5:
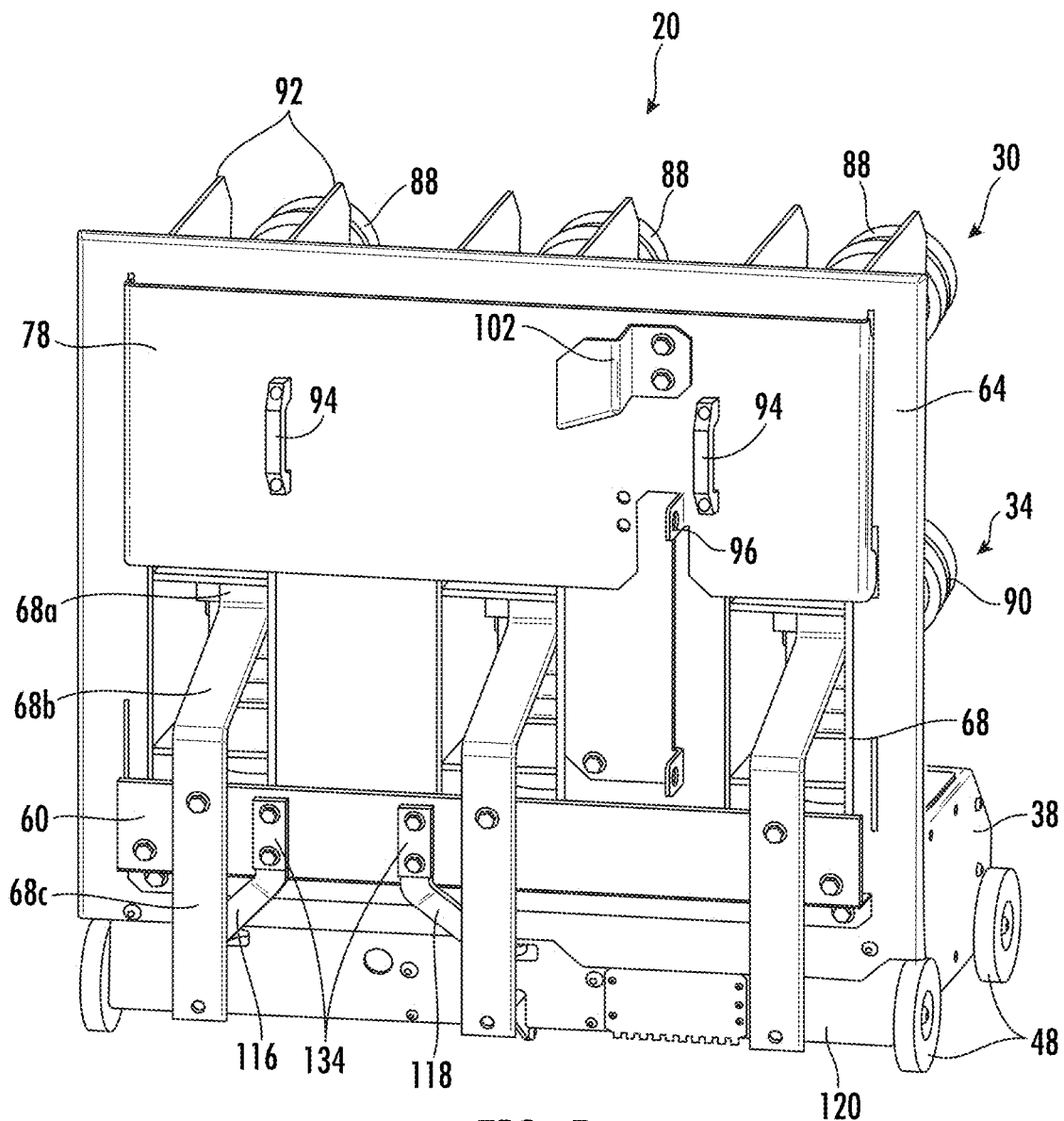
FIG. 5 is another front isometric view similar to FIG. 4, but showing the lower door removed and the grounding bars connected between the lower terminals and lower ground bus bar.

Each grounding bar 68 may be formed as a single piece of metallic bus that is shaped in the configuration as shown in FIGS. 4 and 5 to include the upper flat end 68a, the outwardly angled section 68b, and the vertically extending lower flat section 68c. Grounding bars 68 may vary in dimension, e.g., their length, width, and thickness, but in an example may range anywhere from ⅛ inch thick to ⅜ inch thick as found with bus metal used in switchgear systems and be about 1 inch to 3 inches in width. They may be long enough such that the grounding bars 68 may selectively connect the upper terminals 30 to the lower ground bus bar 60, but not extend well below the test device housing 38 to hit the floor of the switchgear frame 28 and interfere with movement of the test device housing when the grounding bars 68 are connected to the lower terminals 34 and to the lower ground bus bar as shown in FIG. 5. The configuration where the grounding bars 68 are formed from a bus metal and similarly configured and interchangeable with each other is an advantage over those prior art ground and test devices that use a single flexible conductor to ground the upper or lower terminals.

Figure 2:
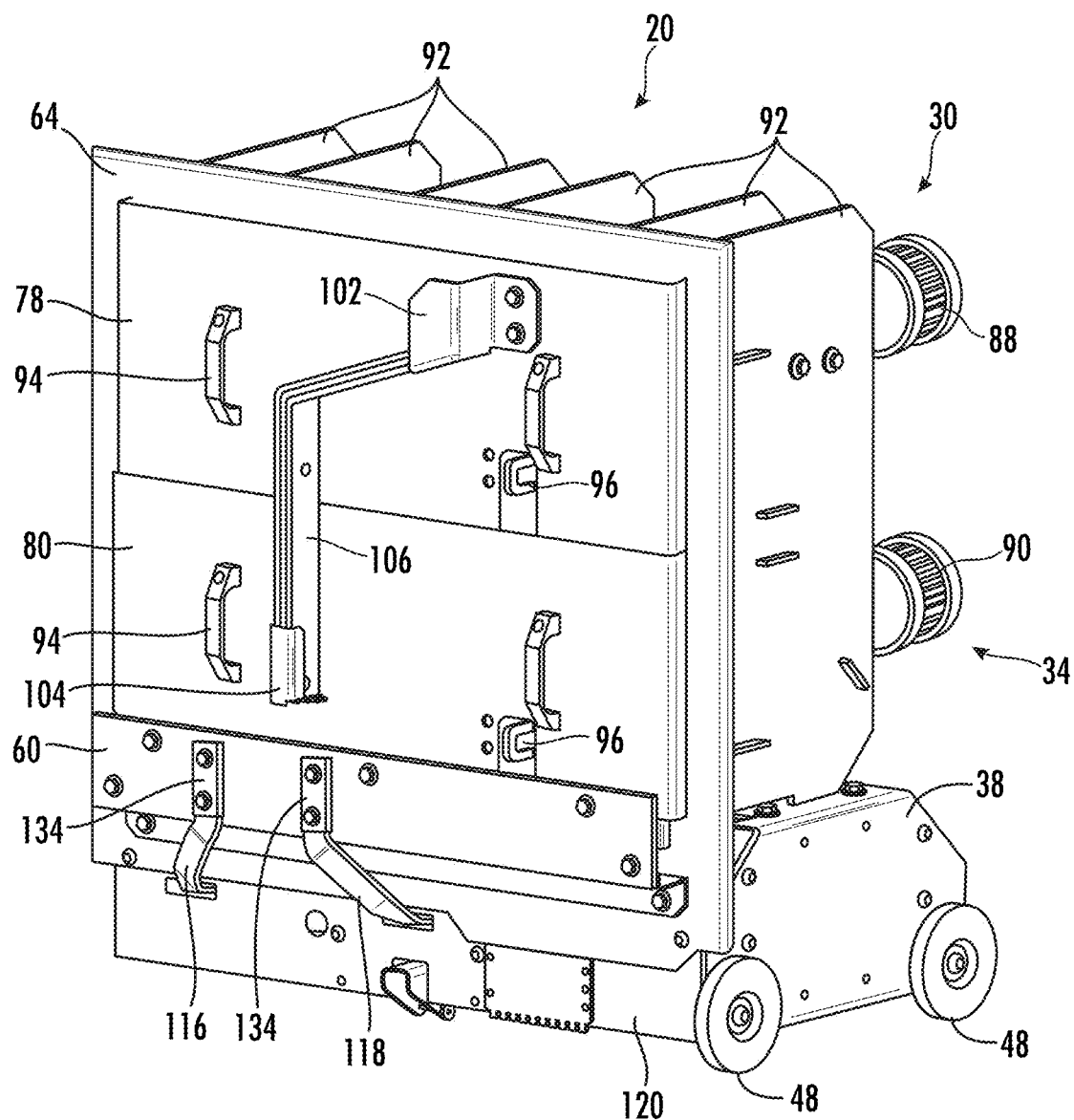
FIG. 2 is a front isometric view of the ground and test device of FIG. 1.
Figure 6:
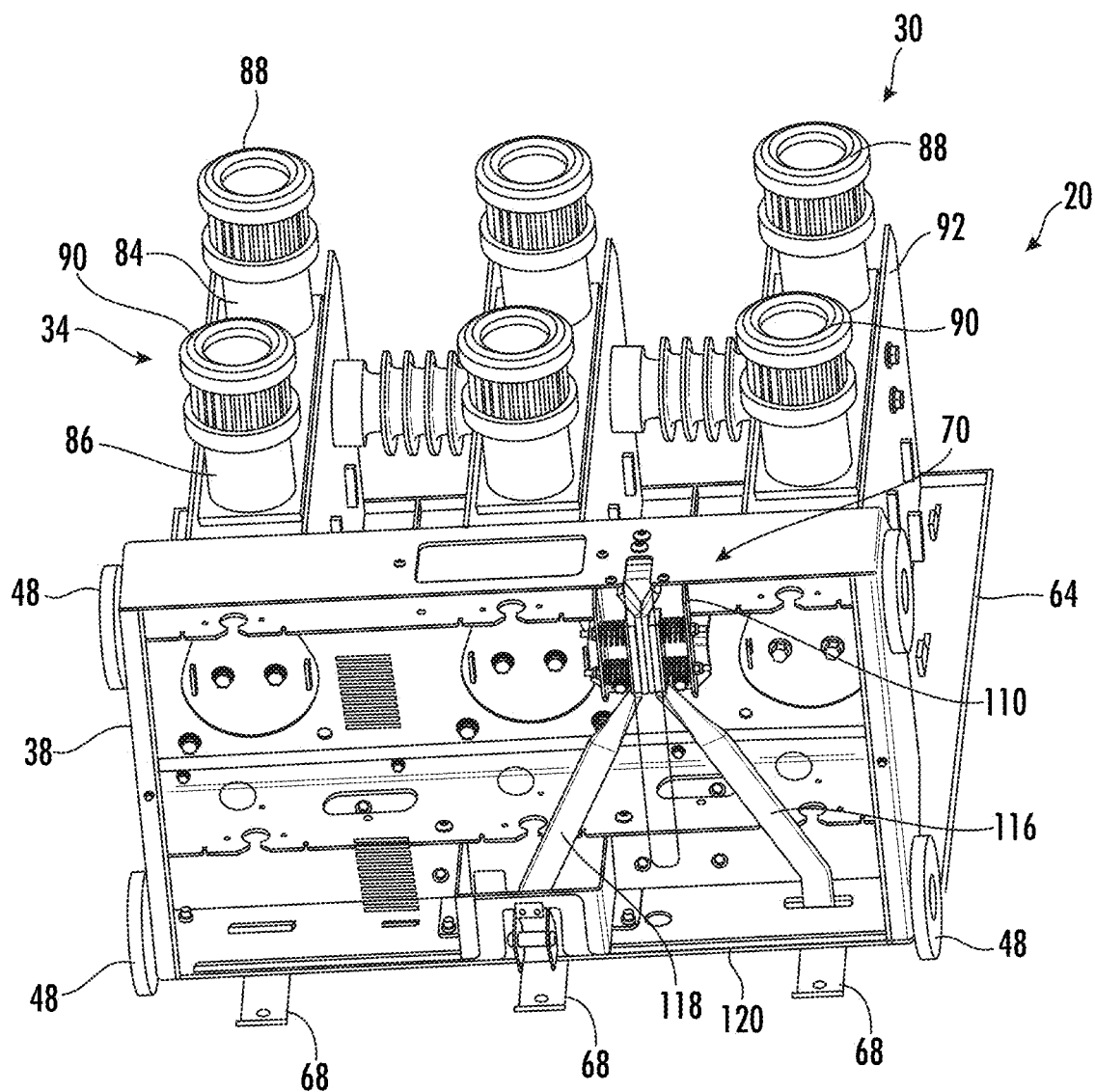
FIG. 6 is a bottom isometric view of the ground and test device showing the ground shoe assembly.
Figure 7:
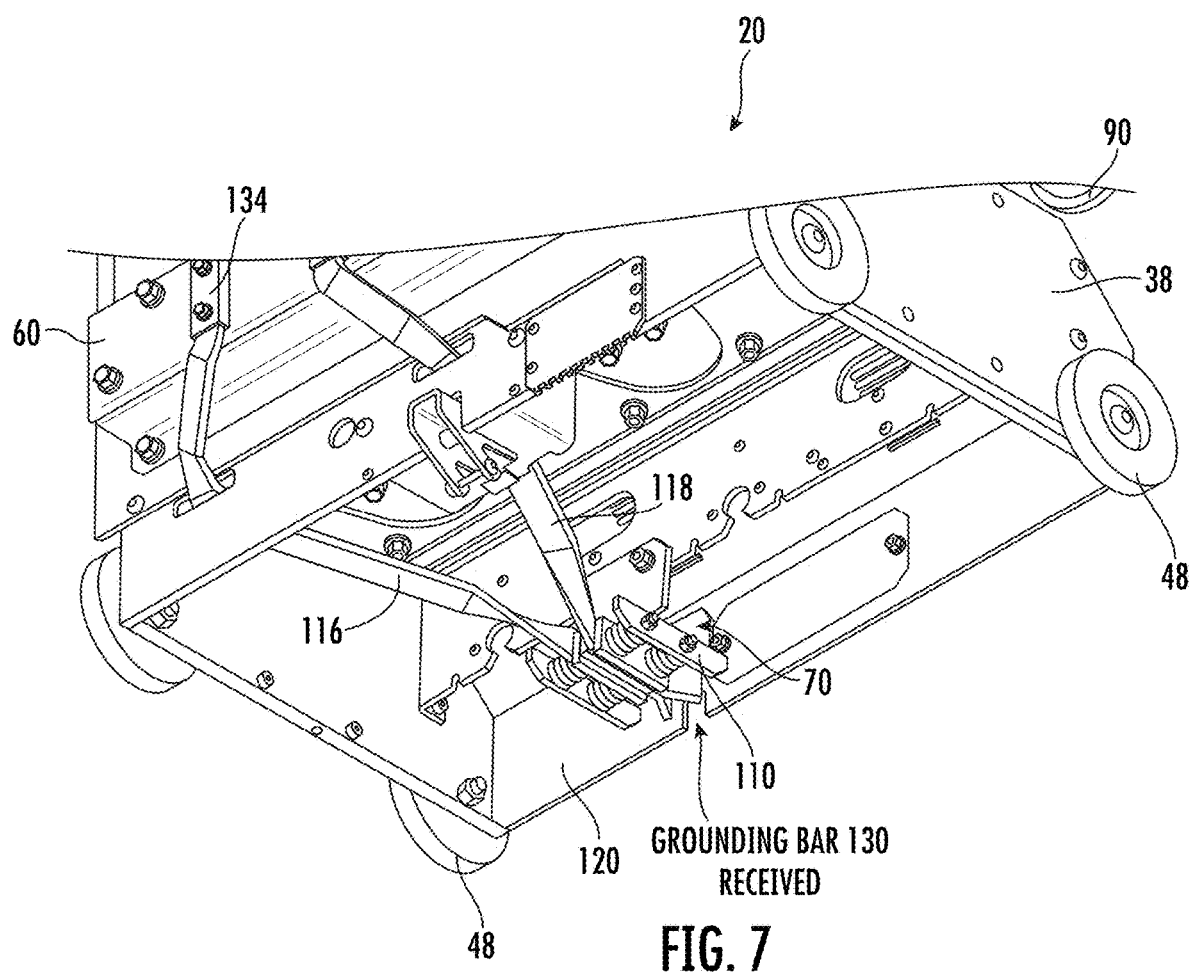
FIG. 7 is another bottom isometric view similar to FIG. 6, but showing a different view of the ground shoe assembly.
Figure 8:
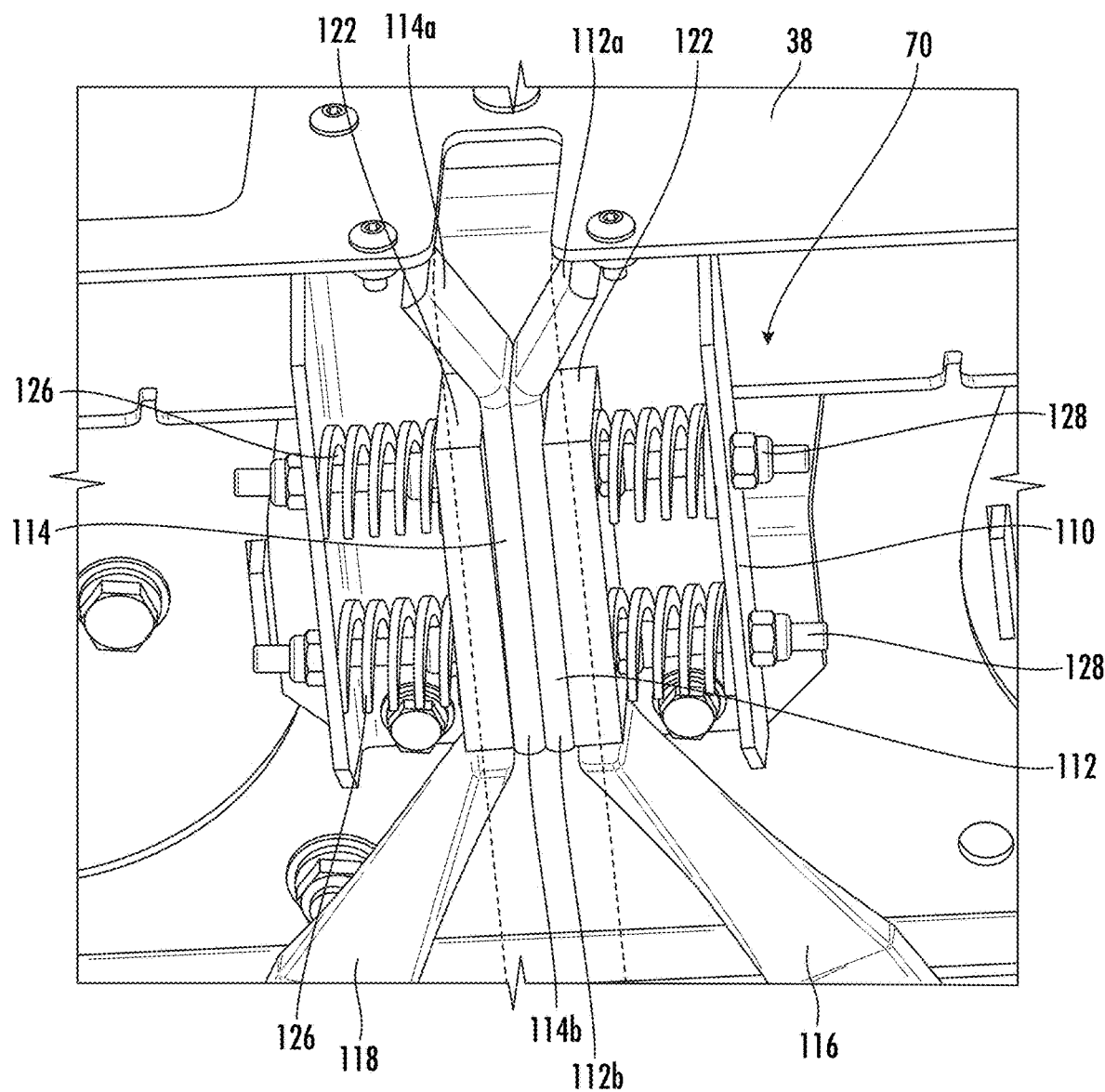
FIG. 8 is an enlarged bottom isometric view of the ground shoe assembly of FIGS. 6 and 7.

Referring now to FIGS. 6-12, further details of the ground shoe assembly 70 are illustrated. The grounds shoe assembly 70 connects to the lower ground bus bar 60 and is configured to engage a grounding circuit 74 (FIG. 1) carried by the switchgear frame 28 when the test device housing 38 is installed within the switchgear compartment 24 of the switchgear frame 28 and connected to load and line conductors 40. Each ground shoe assembly 70 includes a ground shoe bracket 110 that is mounted on the underside of the test device housing 38 (FIGS. 6 and 7). First and second opposing bus bars 112,114 each have first and second ends 112a, 112b and 114a, 114b (FIGS. 8 and 12) and are carried by the ground shoe bracket 110. The first ends 112a, 114a engage the grounding circuit 74. First and second flexible cables 116,118 interconnect each of the second ends 112b, 114b of the first and second bus bars 112,114 to the lower ground bus bar 60 as best shown in FIGS. 6 and 7, in which the first and second flexible cables extend through a blocking plate 120 positioned at the lower section of the front panel 64 and extend upward to connect onto the lower ground bus bar 60 (FIGS. 2-4).

Figure 9:
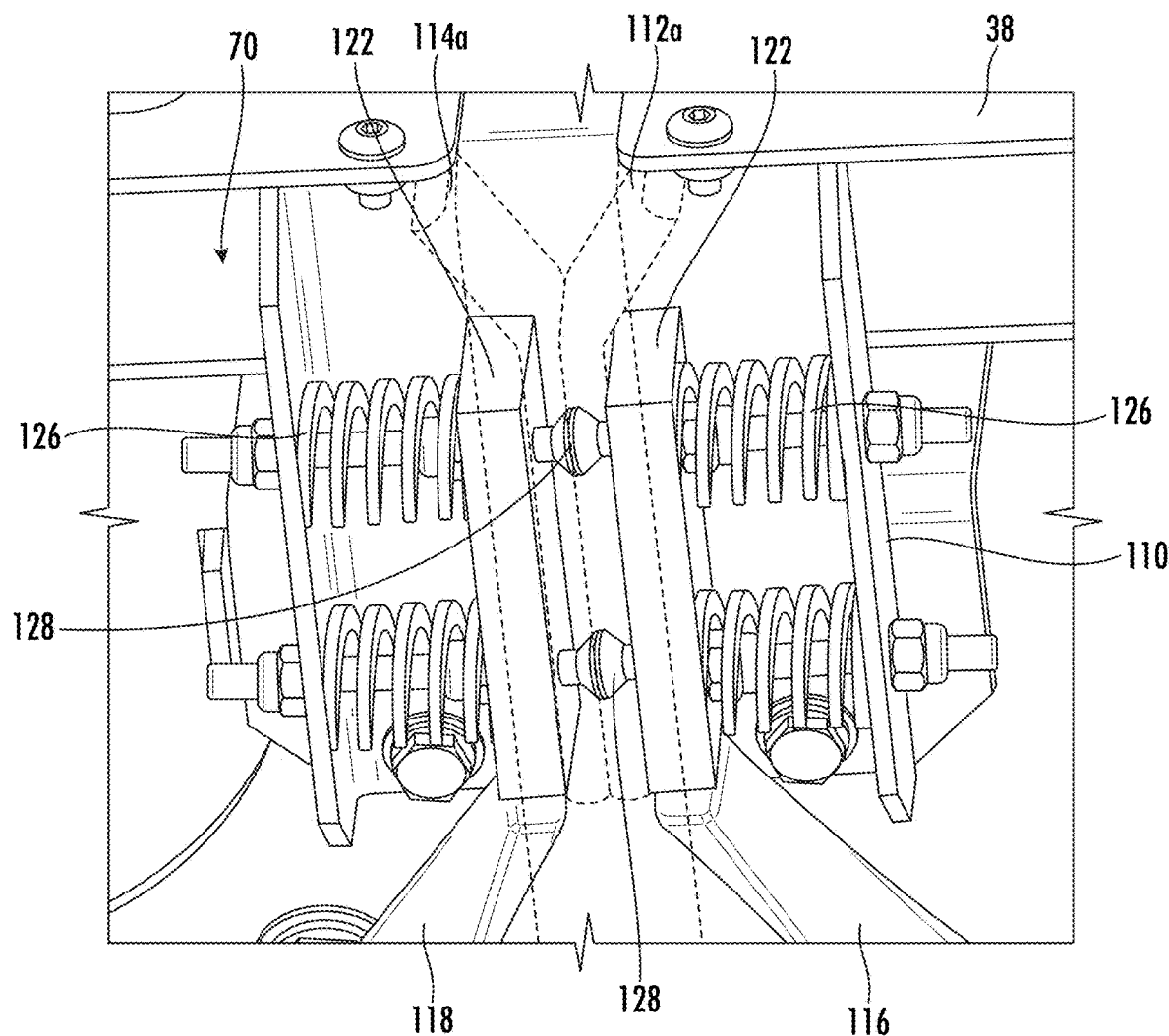
FIG. 9 is another enlarged bottom isometric view of the ground shoe assembly showing in transparency the first and second opposing bus bars and their connection with the ground shoe bracket.

In an example, the first and second flexible cables 116,118 are formed as braided cable. As best shown in the enlarged bottom isometric views of the ground shoe assembly 70 in FIGS. 8, 9, 11, and 12, the flexible cables 116,118 formed as braided cable connect at their end to rectangular configured cable supports 122 that exert a biasing force against the opposing first and second opposing bus bars 112,114 through die springs 126 that are carried by the ground shoe bracket 110, and thus, configured to bias first and second opposing bus bars against each other. As best shown in FIG. 9, the bus bars 112,114 receive countersunk bolts 128 that retain the cable supports 122 and die springs 126 against the ground shoe bracket 110. The first ends 112a, 114a of each of the first and second opposing bus bars 112,114 include flared ends 112a, 114a that extend outward. The grounding circuit 74 includes a vertical grounding bar 130 over which the flared ends 112a, 114a engage as the test device housing 38 is inserted within the compartment of the switchgear frame 28 (FIGS. 1 and 7).

A bottom cover plate (not shown) will cover the bottom section of the test device housing 38 such that the first and second flexible cables 116,118 and the ground shoe bracket 110 are not exposed. The cables 116,118 provide flexibility such that when the test device housing 38 is inserted within the compartment 24 of the switchgear frame 28, the flared first ends 112a, 114a engage the vertical grounding bar 130 and expand outward and separate the first and second opposing bus bars 112,114. The four die springs 126 as illustrated bias the cable supports 122 and provide that sufficient contact exists between the grounding bar 130 and the first and second opposing bus bars 112,114 that connect onto the braided cables 116,118 and provide sufficient grounding surface contact.

Figure 10:
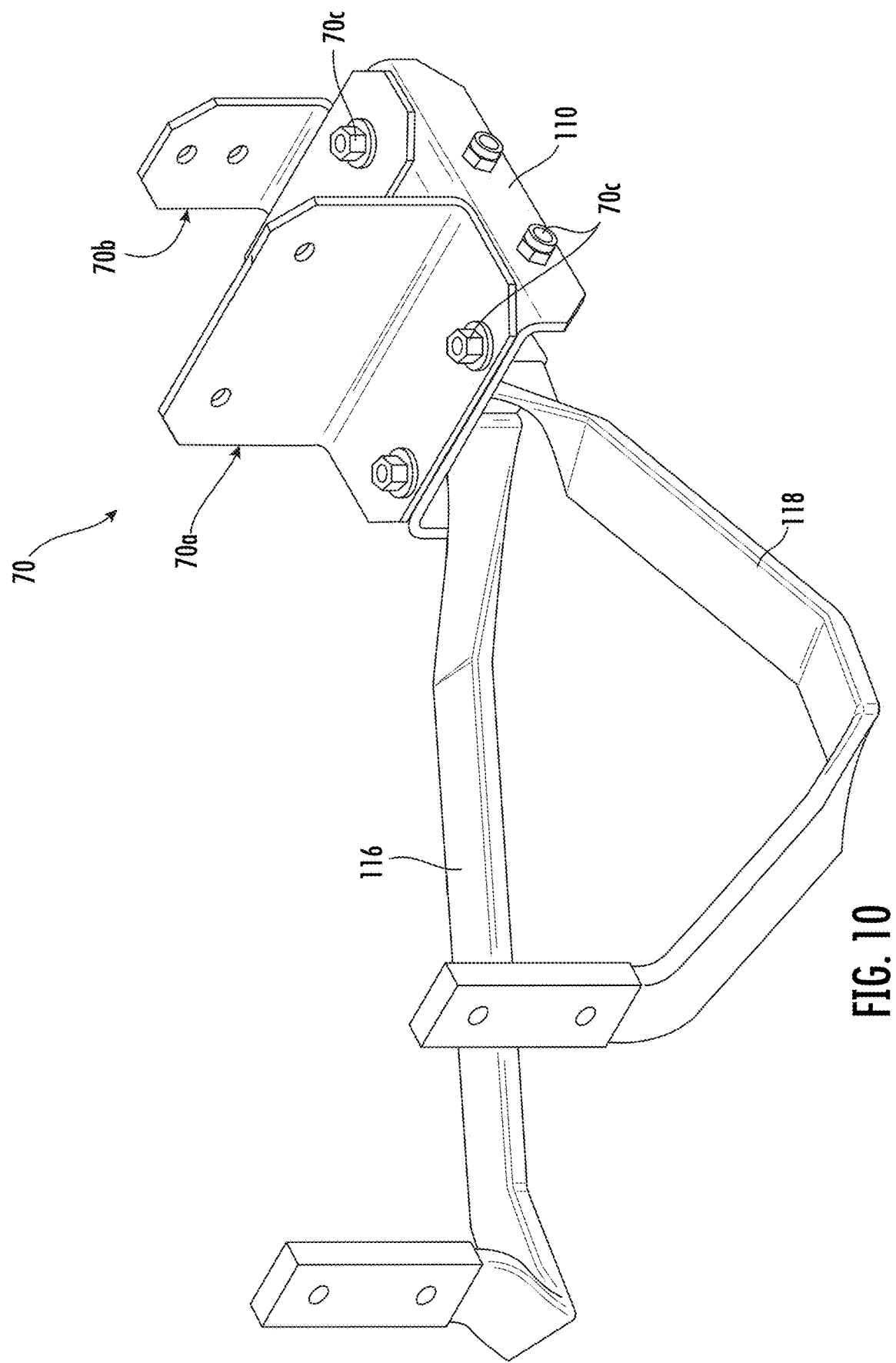
FIG. 10 is an enlarged top isometric view of the ground shoe assembly.
Figure 11:
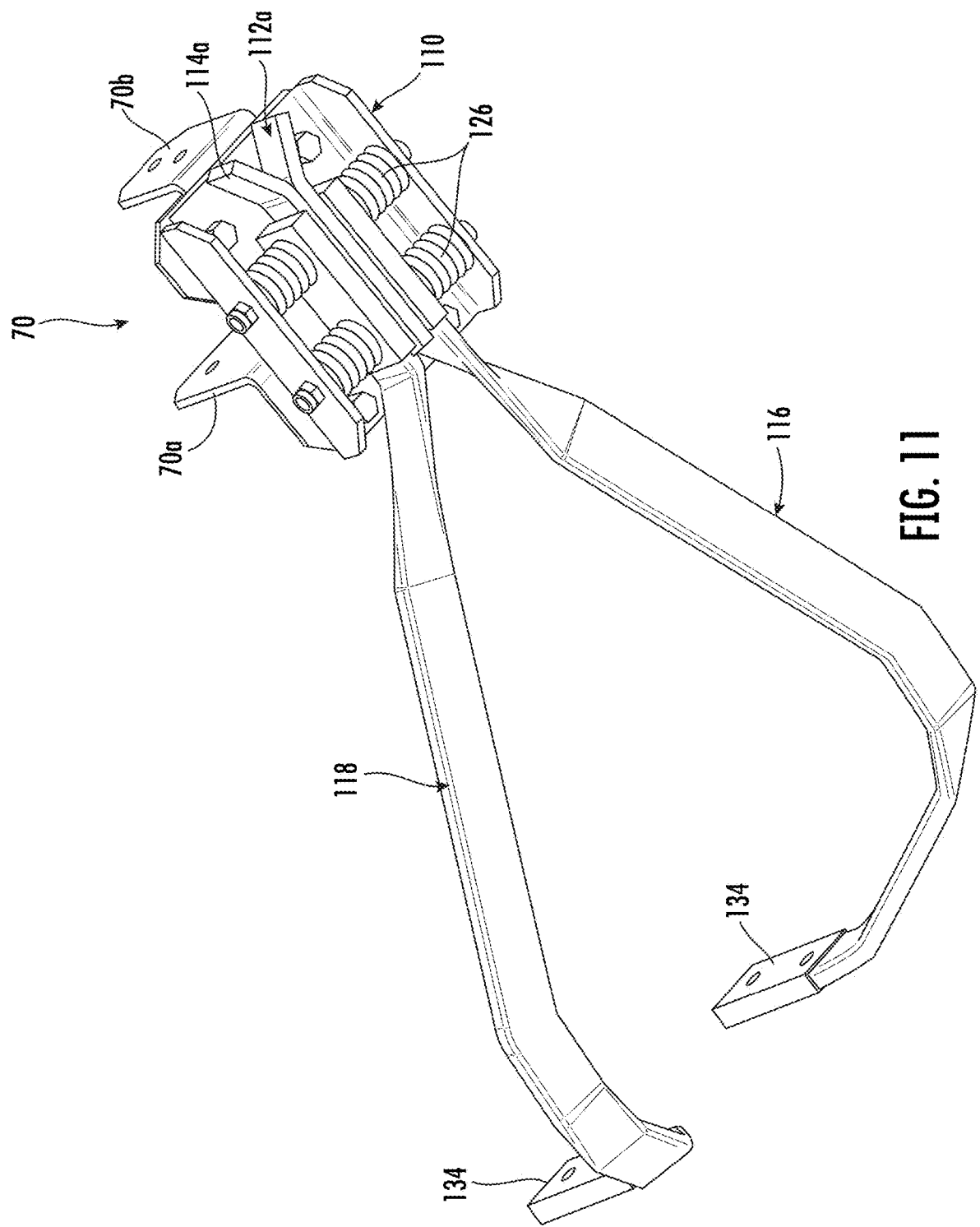
FIG. 11 is an enlarged bottom isometric view of the ground shoe assembly.
Figure 12:
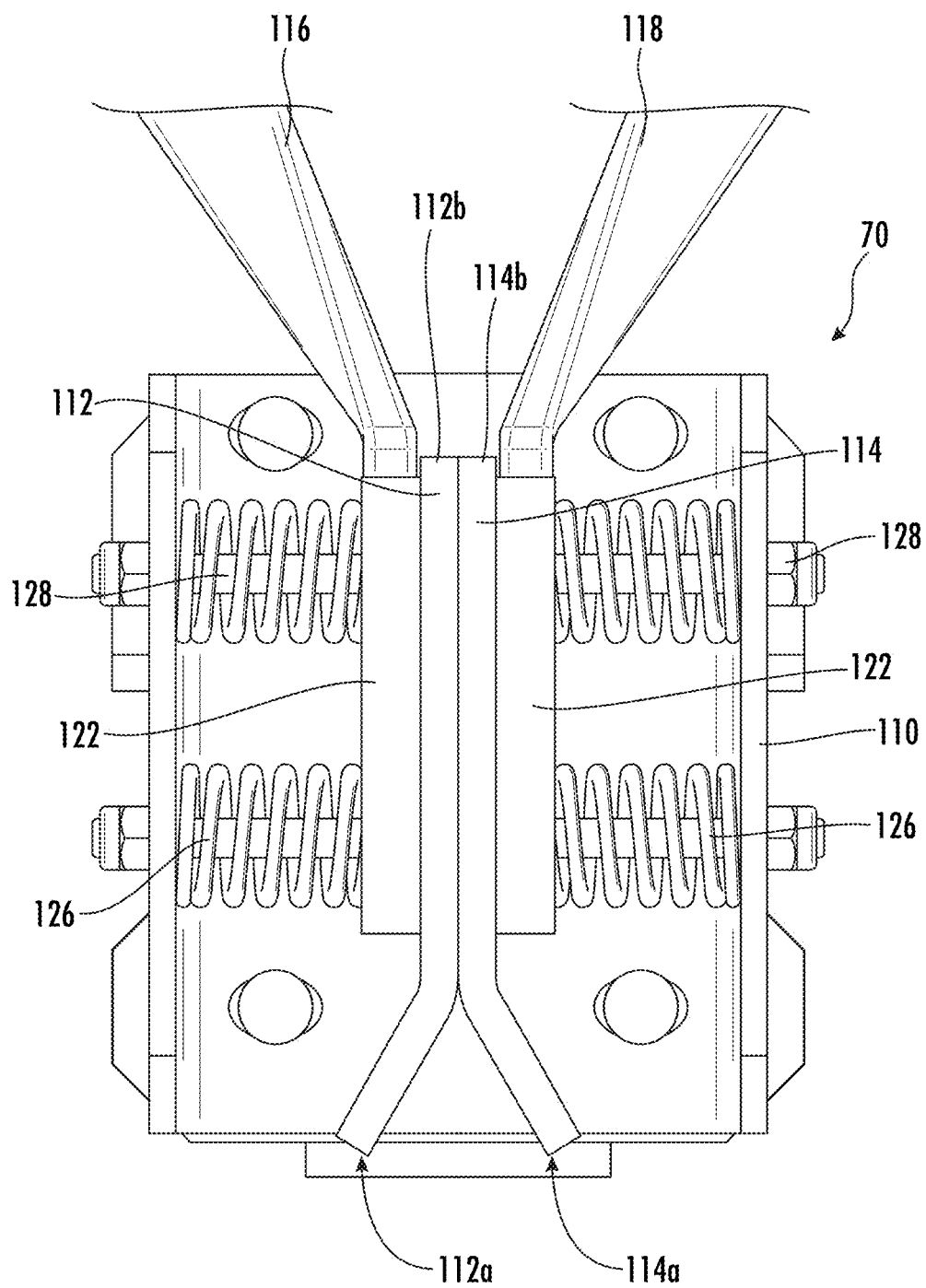
FIG. 12 is an enlarged bottom plan view of the ground shoe assembly.

As shown in FIG. 10, the braided cables 116,118 as the flexible cables provide some rigidity if necessary, and include contact connectors 134 that attachment to the lower ground bus bar 60 carried by the test device housing 38. Other components of the ground shoe assembly 70 may include a ground shoe upper support plate 70a and ground shoe model block bracket 70b and fasteners 70c (FIGS. 10 and 11).

In operation, the ground and test device 20 may be inserted within the compartment 24 of a switchgear frame 28 that has the load and line conductors 40 and testing may occur first followed by grounding. The ground and test device 20 provides an additional measure of safety. The use of the grounding bars 68 that are similarly configured and interchangeable with each other facilitates maintenance and operator safety since there are no cables to be swapped. The same grounding bars 68 may be used for each of the different three-phase load and line conductors 40 to ground them via the grounding bars 68.

Figure 13:
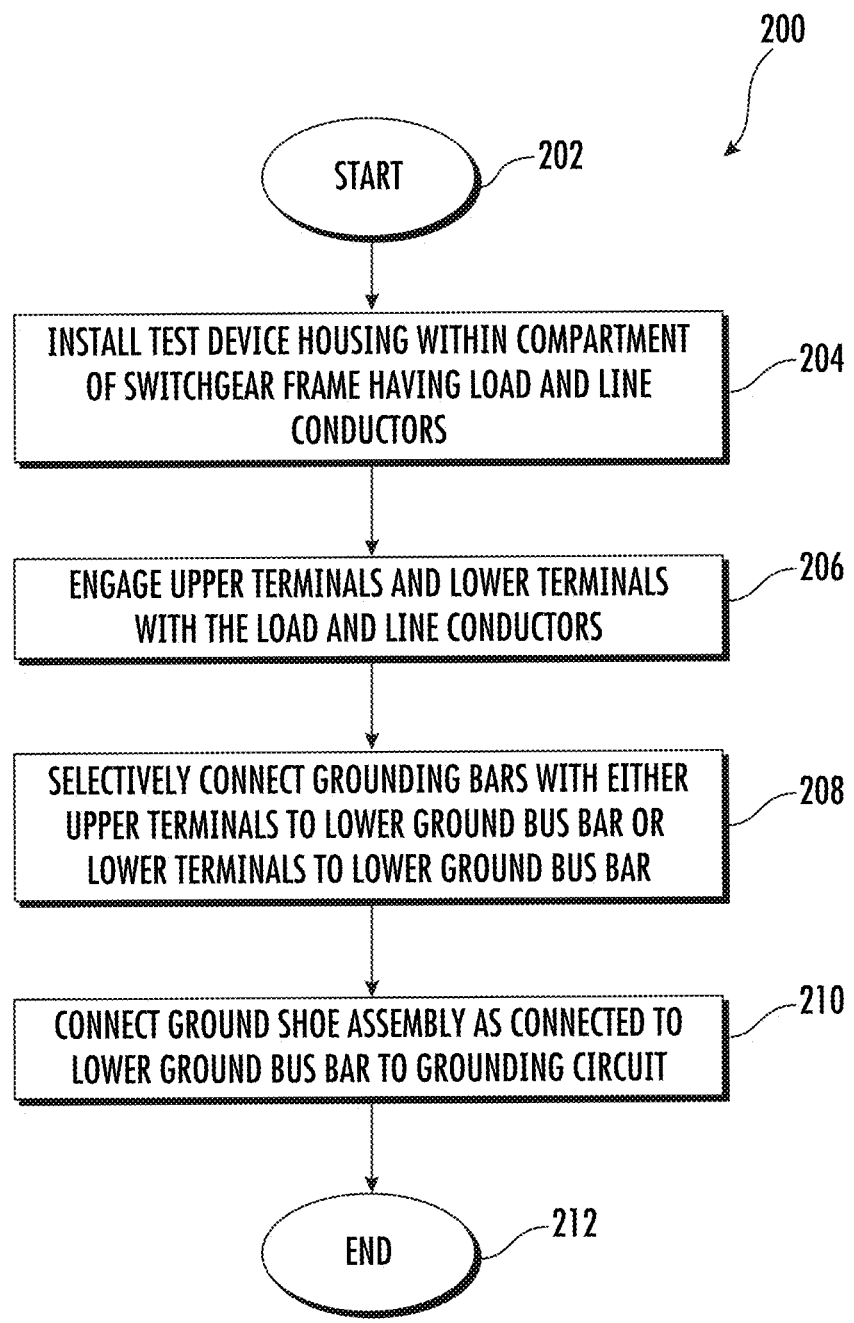
FIG. 13 is a high-level flowchart of an example method of operating the ground and test device.

Referring now to FIG. 13, a high-level flowchart of an example method of operating the ground and test device 20 is illustrated at 200. The process starts (Block 202) and the test device housing 28 is installed within a switchgear compartment 24 of the switchgear frame 28 having load and line conductors 40 (Block 204). A plurality of upper terminals 30 and a plurality of lower terminals 34 are carried by the test device housing 38 and engage the load and line conductors 40 (Block 206). The method includes selectively connecting a plurality of grounding bars 68 with either the upper terminals 30 to the lower ground bus bar 60 carried by the test device housing 38 or connecting the lower terminals 34 to the lower ground bus bar (Block 208). A ground shoe assembly 70 is connected to the lower ground bus bar 60 and engages the grounding 74 circuit carried by the switchgear frame 28 (Block 210). The process ends (Block 212).

The ground and test device 20 may be used for testing of target electrical apparatus for different test states. Both line and load circuits may be tested. The ground and test device 20 may be used to test utility, commercial, industrial, and residential environments, including distribution stations, main stations, power plants, shops and offices, commercial buildings, industrial production facilities, and similar units. Line voltage can be sensed.

Figure 14:
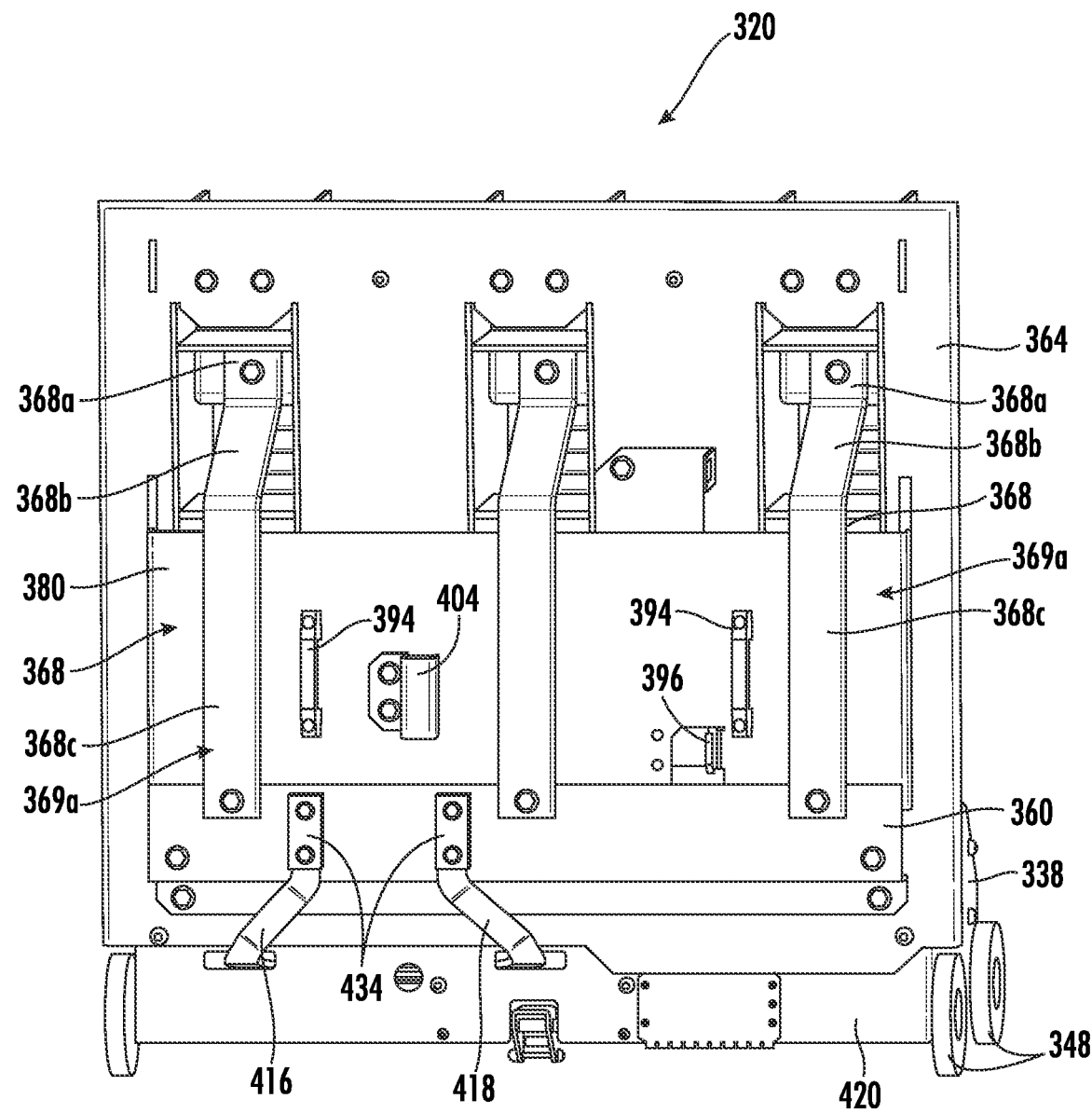
FIG. 14 is a front isometric view of another embodiment of the ground and test device showing a first set of grounding bars that connect upper terminals to the lower ground bus bar.
Figure 15:
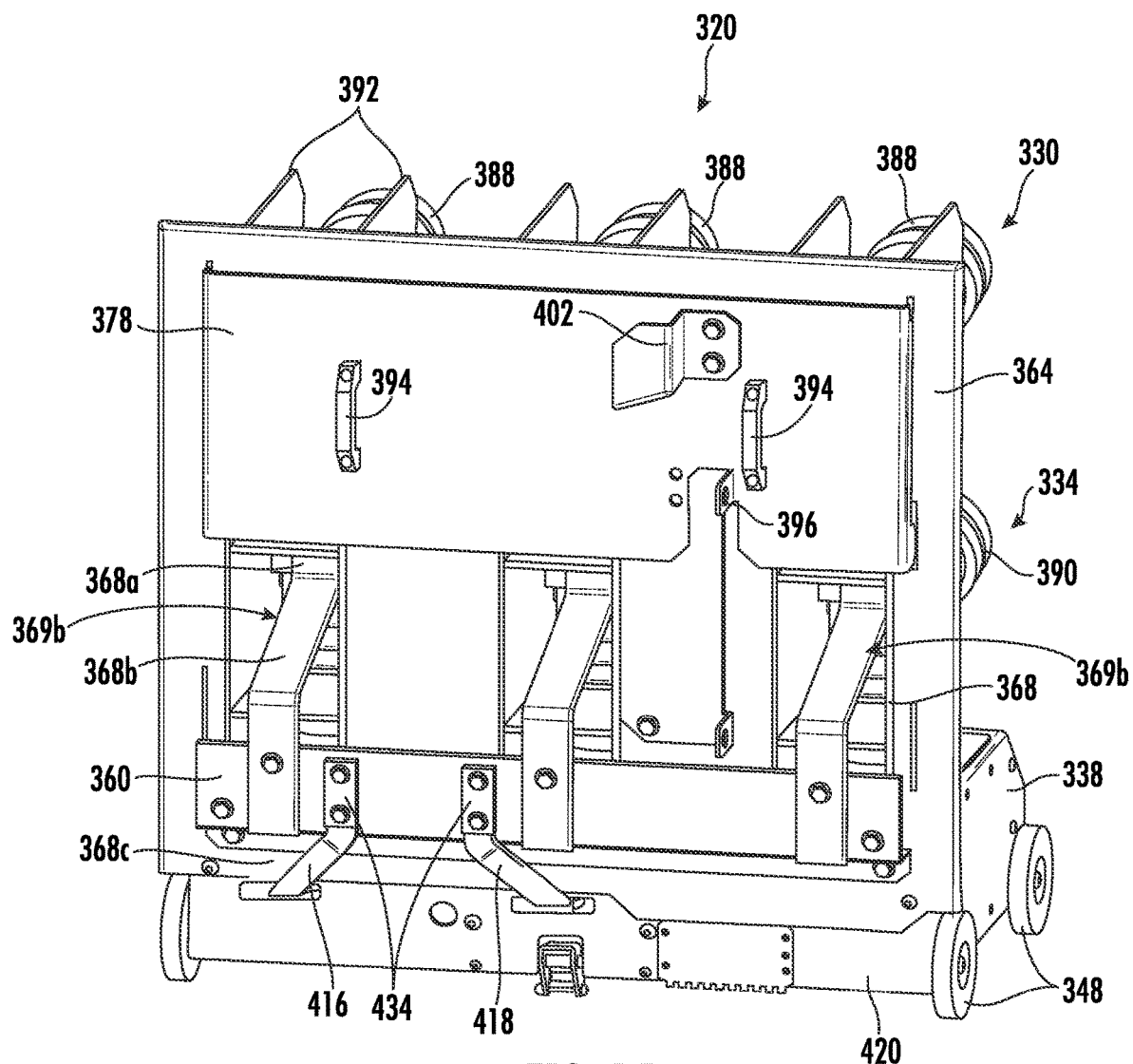
FIG. 15 is a front isometric view similar to FIG. 14 showing a second set of grounding bars that connect lower terminals to the lower ground bus bar.

Referring now to FIGS. 14 and 15, there are illustrated a second embodiment of the ground and test device 320 that has first and second sets of grounding bars. Reference numbers are similar as in FIGS. 1-13, except in the 300 and 400 series. The device 320 includes a plurality of grounding bars 368 that selectively connect either the upper terminals 330 to the lower ground bus bar 360 or connect the lower terminals 334 to the lower ground bus bar 360. The plurality of grounding bars 368 includes a first set 369a of grounding bars that connect the upper terminals 330 to the lower ground bus bar 360 and a second set 369b of grounding bars that connect the lower terminals 334 to the lower ground bus bar when the first set of grounding bars are not connected. The ground shoe assembly 70 as described before is the same in configuration as described with reference to FIGS. 1-13.

In an example, the first set 369a of grounding bars 368 are similarly configured to the second set 369b of grounding bars except the second set of grounding bars have a shorter, vertically extending lower flat section 368c. There is also no central fastener opening for receiving a fastener as shown in FIGS. 4 and 5, where the fastener opening is shown above where the grounding bars 68 are connected to the lower ground bus bar 60. This configuration shown in FIGS. 14 and 15 provides a technical benefit since the current does not get necked down in the area by the central fastener opening and begin overheating in that area. With the configuration in FIGS. 14 and 15, a larger lower ground bus bar 360 is not required.

The ground and test device 320 in FIGS. 14 and 15 is similar as described above with reference to FIGS. 1-13 and includes the test device housing 338 configured to be removably installed within a compartment of a switchgear frame having load and line conductors. A plurality of upper terminals 330 and plurality of lower terminals 334 are carried by the test device housing 338 and configured to engage the load and line conductors when the test device housing is installed within a compartment of the switchgear frame. A lower ground bus bar 360 is carried by the test device housing 338.

As noted before, the plurality of grounding bars 368 selectively connect either the upper terminals 330 to the lower ground bus bar 360 or connect the lower terminals 334 to the lower ground bus bar 360. This plurality of grounding bars 368 includes the first set 369a of grounding bars that connect the upper terminals 330 to the lower ground bus bar 360 and the second set 369b of grounding bars that connect the lower terminals 334 to the lower ground bus bar when the first set of grounding bars are not connected. As noted before, the ground shoe assembly 70 is formed similar to that as shown in FIGS. 6-12 and as described above.

Each grounding bar 368 in first and second sets 369a,369b includes an upper flat end 368a that is configured to engage the respective upper or lower terminal 330,334, and outwardly angled section 368b that extends outward from the test device housing 338 and vertically extending lower flat section 368c that is configured to engage the lower ground bus bar 360. The test device housing 338 includes a front panel 364 having removable upper and lower doors 378,380 to expose upper and lower terminals 330,334, which the grounding bars are secured. The upper and lower terminals 330,334 each include upper and lower contact arms, each carrying cluster assemblies 388,390 that engage load and line conductors. Other components are illustrated in FIGS. 14 and 15, including the pull handle 394, upper bus bracket 402, lower bus bracket 404, lock mechanism 396, contact connectors 434, first and second flexible cables 416,418, blocking plate 420, wheels 348, and front panel 364.

A method of operating the ground and test device 320 includes installing a test device housing 328 within a compartment of a switchgear frame having load and line conductors. The method includes engaging a plurality of upper terminals 330 and a plurality of lower terminals 334 carried by the test device housing 328 with the load and line conductors. The method further includes selectively connecting a plurality of grounding bars 368 with either the upper terminals 330 to the lower ground bus bar 360 or the lower terminals 334 to the lower ground bus bar. The plurality of grounding bars 368 includes a first set 369a of grounding bars that connect the upper terminals 330 to the lower ground bus bar 360 and a second set 369b of grounding bars that connect the lower terminals 334 to the lower ground bus bar when the first set of grounding bars are not connected. The method includes connecting a ground shoe assembly 70 (FIGS. 6-12) to the lower ground bus bar 360 and configured to engage a grounding circuit carried by the switchgear frame.

As shown in FIGS. 6-12, the ground shoe assembly includes a ground shoe bracket 110 and first and second opposing bus bars 112,114 each having first and second ends 112a,112b and carried by the ground shoe bracket. The first ends 112a engage the grounding circuit and first and second flexible cables 116,118 (416 and 418 in FIGS. 14 and 15)

interconnect each of the second ends to the lower ground bus bar. Die springs 126 are carried by the ground shoe bracket and may insert a biasing force against first and second bus bars 112,114 either upon ground and test device 320 insertion or only when insertion is completed.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A ground and test (G&T) device, comprising:
    a test device housing configured to be removably installed within a compartment of a switchgear frame having load and line conductors;
    a plurality of upper terminals and plurality of lower terminals carried by the test device housing and configured to engage the load and line conductors when the test device housing in installed within the compartment of the switchgear frame;
    a lower ground bus bar carried by the test device housing;
    a plurality of grounding bars that selectively connect either the upper terminals to the lower ground bus bar or connect the lower terminals to the lower ground bus bar, said plurality of grounding bars comprising a first set of grounding bars that connect the upper terminals to the lower ground bus bar and a second set of grounding bars that connect the lower terminals to the lower ground bus bar when the first set of grounding bars are not connected; and
    a ground shoe assembly connected to the lower ground bus bar and configured to engage a grounding circuit carried by the switchgear frame, wherein said ground shoe assembly comprises a ground shoe bracket and first and second opposing bus bars each having first and second ends and carried by said ground shoe bracket, said first ends engaging the grounding circuit, and first and second flexible cables interconnecting each of said second ends to the lower ground bus bar, and die springs carried by said ground shoe bracket and exerting a biasing force against first and second bus bars.

2. The G&T device of claim 1, wherein each grounding bar in first and second sets comprises an upper flat end that is configured to engage the respective upper or lower terminal, an outwardly angled section that extends outward from the test device housing, and a vertically extending lower flat section that is configured to engage the lower ground bus bar.

3. The G&T device of claim 1, wherein said test device housing includes a front panel having removable upper and lower doors to expose upper and lower terminals onto which the grounding bars are secured.

4. The G&T device of claim 1, wherein said upper and lower terminals comprise upper and lower contact arms each carrying cluster assemblies that engage load and line conductors.

5. The G&T device of claim 1, wherein each of said first ends of each of said first and second opposing bus bars include flared ends that extend outward, and said grounding circuit includes a grounding bar over which the flared ends engage as the test device housing is inserted within the compartment of the switchgear frame.

6. The G&T device of claim 1, wherein said first and second flexible cables each comprises a braided cable.

7. A ground and test (G&T) device, comprising:
    a test device housing configured to be removably installed within a compartment of a switchgear frame having three-phase load and line conductors, wherein said test device housing includes a front panel having removable upper and lower doors;
    three upper terminals and three lower terminals carried by the test device housing and configured to engage the respective three-phase load and line conductors when the test device housing in installed within the compartment of the switchgear frame, each of said three upper terminals and three lower terminals configured to carry single-phase power, wherein the upper and lower terminals are configured such that upper terminals are exposed when the upper doors are removed and lower terminals are exposed when the lower doors are removed;
    a lower ground bus bar carried by the test device housing;
    a plurality of grounding bars that selectively connect either the upper terminals to the lower ground bus bar or connect the lower terminals to the lower ground bus bar, said plurality of grounding bars comprising a first set of grounding bars that connect the upper terminals to the lower ground bus bar and a second set of grounding bars that connect the lower terminals to the lower ground bus bar when the first set of grounding bars are not connected; and
    a ground shoe assembly connected to the lower ground bus bar and configured to engage a grounding circuit carried by the switchgear frame, wherein said ground shoe assembly comprises a ground shoe bracket and first and second opposing bus bars each having first and second ends and carried by said ground shoe bracket, said first ends engaging the grounding circuit, and first and second flexible cables interconnecting each of said second ends to the lower ground bus bar, and die springs carried by said ground shoe bracket and exerting a biasing force against first and second bus bars.

8. The G&T device of claim 7, wherein each grounding bar in first and second sets comprises an upper flat end that is configured to engage the respective upper or lower terminal, an outwardly angled section that extends outward from the test device housing, and a vertically extending lower flat section that is configured to engage the lower ground bus bar.

9. The G&T device of claim 7, wherein said upper and lower terminals comprise upper and lower contact arms each carrying cluster assemblies that engage load and line conductors.

10. The G&T device of claim 7, wherein each of said first ends of each of said first and second opposing bus bars include flared ends that extend outward, and said grounding circuit includes a grounding bar over which the flared ends engage as the test device housing is inserted within the compartment of the switchgear frame.

11. The G&T device of claim 7, wherein said first and second flexible cables each comprises a braided cable.

12. A method of operating a ground and test (G&T) device, comprising:
    installing a test device housing within a compartment of a switchgear frame having load and line conductors;
    engaging a plurality of upper terminals and a plurality of lower terminals carried by the test device housing with the load and line conductors;
    selectively connecting a plurality of grounding bars with either the upper terminals to the lower ground bus bar or the lower terminals to the lower ground bus bar, said plurality of grounding bars comprising a first set of grounding bars that connect the upper terminals to the lower ground bus bar and a second set of grounding bars that connect the lower terminals to the lower ground bus bar when the first set of grounding bars are not connected; and connecting a ground shoe assembly to the lower ground bus bar and configured to engage a grounding circuit carried by the switchgear frame, wherein said ground shoe assembly comprises a ground shoe bracket and first and second opposing bus bars each having first and second ends and carried by said ground shoe bracket, said first ends engaging the grounding circuit, and first and second flexible cables interconnecting each of said second ends to the lower ground bus bar, and die springs carried by said ground shoe bracket and exerting a biasing force against first and second bus bars.

13. The method of claim 12, wherein said each grounding bar in first and second sets comprises an upper flat end that is configured to engage the respective upper or lower terminal, an outwardly angled section that extends outward from the test device housing, and a vertically extending lower flat section that is configured to engage the lower ground bus bar.

14. The method of claim 12, wherein the test device housing includes a front panel having removable upper and lower doors to expose upper and lower terminals onto which the grounding bars are secured.

15. The method of claim 12, wherein the upper and lower terminals comprise upper and lower contact arms each carrying cluster assemblies that engage load and line conductors.

16. The method of claim 12, wherein each of said first ends of each of said first and second opposing bus bars included flared ends that extend outward, and said grounding circuit includes a grounding bar over which the flared ends engage as the test device housing is inserted within the compartment of the switchgear frame.

17. The method of claim 12, wherein said first and second flexible cables each comprises a braided cable.

* * * * *